United States Patent [19]
Bauscher et al.

[11] Patent Number: 6,152,166
[45] Date of Patent: *Nov. 28, 2000

[54] APPARATUS FOR DIVIDING A GAS STREAM INTO SEVERAL PARTIAL GAS STREAMS

[75] Inventors: Heinz Bauscher, Langenselbold; Klaus Ruppert, Maintal, both of Germany

[73] Assignee: Heraeus Quarzglas GmbH & Co KG, Hanau, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/587,359

[22] Filed: Jan. 16, 1996

[30] Foreign Application Priority Data

Jan. 20, 1995 [DE] Germany .............. 195 01 733

[51] Int. Cl.[7] ........................................ F16L 57/00
[52] U.S. Cl. .................. 137/334; 137/269; 137/561 A; 137/597
[58] Field of Search ...................... 137/334, 597, 137/561 A, 269

[56] References Cited

U.S. PATENT DOCUMENTS

| | | | |
|---|---|---|---|
| 3,785,402 | 1/1974 | Collier | 137/561 A |
| 4,263,939 | 4/1981 | Bird | 137/613 |
| 5,056,597 | 10/1991 | Stowe, III | 137/561 A |
| 5,116,400 | 5/1992 | Abbott et al. | 65/144 |
| 5,311,850 | 5/1994 | Martin | 137/561 A |
| 5,334,352 | 8/1994 | Johnson | 137/561 A |

*Primary Examiner*—A. Michael Chambers
*Attorney, Agent, or Firm*—Fulbright & Jaworski, LLP

[57] ABSTRACT

An equalization chamber has a first plurality of gas inlet openings for a gas stream and a second plurality of gas outlet openings for partial gas streams, each outlet being connected by way of a gas line to a gas consumer, the maximum flow resistance for each partial gas stream being located in the area under the gas outlet openings, seen in the flow direction of the partial gas streams. To guarantee the highest possible degree of uniformity and reproducibility of the gas supply to the consumers, the maximum flow resistance for each partial gas stream is provided in the gas line between the gas outlet opening and the gas consumer.

8 Claims, 2 Drawing Sheets

APPARATUS FOR DIVIDING A GAS STREAM INTO SEVERAL PARTIAL GAS STREAMS

BACKGROUND OF THE INVENTION

The invention pertains to apparatus for dividing a gas stream into several partial gas streams, the apparatus having an equalization chamber with a gas inlet for the gas stream and several gas outlet openings for the partial gas streams. Each of these outlet openings is connected by way of a gas line to a gas consumer, the maximum flow resistance for each partial gas stream being provided in the area which, looking in the flow direction of the partial gas streams, is under the gas outlets.

Apparatus such as this, referred to in the following as a "flow divider", is known from U.S. Pat. No. 5,116,400. The flow divider described therein is used to supply a multi-burner assembly with burner gases. The multi-burner assembly is used to deposit $SiO_2$ soot onto an elongated support body, which is rotated around its longitudinal axis. For this purpose, the burners are guided axially back and forth for a short distance along the support body, this distance being approximately equal to that between the individual burners.

To produce a homogeneous soot body, it is important for each burner to build up the deposit at the same rate as all the other burners. If the individual burners have different build-up rates, the external geometry of the soot body will be irregular. Unequal build-up rates of the individual burners can be caused by fluctuations in the gas supply or by production-related deviations from ideal burner geometry. To guarantee the same build-up rate for all burners of a multi-burner assembly, U.S. Pat. No. 5,116,400 proposes that an equalization tank be provided in the gas supply system, the tank being provided with a gas inlet and with a number of gas outlets corresponding to the number of burners. The opening of the gas inlet has a larger cross section than that of the various gas outlets. The area of the maximum pressure drop should accordingly be located in the part of the burner where the burners are as similar as possible to each other. This part then corresponds at the same time to the maximum flow resistance of the gas supply system.

In the production of quartz glass by means of the soot deposition process, corrosive media such as silicon tetrachloride ($SiCl_4$) are often required. Burners made of metal are chemically attacked by these media, or they are warped by the high temperatures. The burners are therefore normally made of quartz glass. In the case of quartz glass tubes, however, it is difficult to arrive at precisely the required inside diameter and therefore difficult to arrive at precisely the desired maximum flow resistance.

But even under the assumption that the burners all have the same geometry, the known device does not guarantee that all the burners will have approximately the same build-up rate relative to each other at every moment of the soot deposition process. It has been found that pressure differences develop inside the equalization tank, with the result that different pressures are reached at the gas outlets. This necessarily leads in the case of geometrically identical burners to different build-up rates relative to each other.

It is also possible, however, for the absolute build-up rate of all the burners to vary over the course of soot body buildup as a result of variations in the gas volume supplied through the gas inlet. The conventional method of controlling the burner gas feed is to use rotameters or mass flow controllers (MFC's). The principle of mass flow control is based on the conduction of heat through the gas flow to be measured. Temperature changes in the area of the MFC's or changes in the MFC as a result of corrosion by aggressive media such as $SiCl_4$, for example, can cause a drift in the control function over time. A drift such as this in the controlled flow rate of the gas being supplied by way of the MFC's brings about a change in the deposition rate of all the burners and causes an axial inhomogeneity in the microstructure of the soot body.

The invention is therefore based on task of providing a device which can be manufactured easily and at low cost and which guarantees the highest possible degree of uniformity and reproducibility of the gas feed to the gas consumers.

SUMMARY OF THE INVENTION

According to the invention the gas inlet comprises several gas inlet openings, and the maximum flow resistance for each partial gas stream is provided in the gas line between the gas outlet opening and the gas consumer.

The term "gas inlet" refers to all the components necessary for the guidance of the gas stream to be introduced into the equalization chamber, including the gas inlet openings in the walls of the equalization chamber. Because the gas inlet comprises several gas inlet openings, it is possible to divide the gas stream entering the equalization chamber into several smaller partial streams, which can be controlled independently of each other. As a result, temporal fluctuations or inaccuracies in the control of the partial streams are averaged out. At the very least, such fluctuations over time or inaccuracies in the individual partial streams are not nearly so serious as they are when only one gas stream is present. Designing the equalization chamber with several gas inlet openings also makes it possible to distribute the gas inlet openings in such a way that the smallest possible pressure gradient is produced inside the equalization chamber. The greater the distance between the gas inlet and the gas outlet opening, the greater the pressure gradient. Therefore, when it is desired to avoid large pressure gradients, especially in the case of elongated, cylindrical equalization chambers, it is necessary to provide not one central gas inlet but rather several gas inlet openings for the partial streams.

The term "equalization chamber" is used to mean the entire intercommunicating hollow space between the gas inlet openings and the gas outlet openings, within which any pressure, mass, or volume differences of the incoming partial streams can be equalized.

Because the maximum flow resistance for each partial gas stream is provided in the gas line between the gas outlet opening and the consumer, this maximum resistance can be installed at any point in the gas line outside the gas consumer, especially at points where the thermal and chemical loads are low. In addition, through the designed-in separation of the point of maximum resistance from the consumer, any contamination which may proceed from the consumer is excluded. The flow resistance therefore remains constant. It can also be made of easy-to-process materials. It is not necessary to make the flow resistance in question out of quartz glass; it can therefore be adjusted precisely, and it is also readily accessible in the gas line.

The gas line offers the maximum flow resistance (also referred to in the following only as "flow resistance") at the point where the pressure drop of the partial gas stream in question is at a maximum; this is, as a rule, the point with the smallest open cross section. A part of the gas line or the entire gas line, for example, can form the flow resistance. The flow resistance can also be inserted into the gas line. The term "gas line" is used to mean any connection through which a gas can flow between the gas outlet openings and the gas consumers. Any gas line can also have one or more components. Several gas lines can also be connected together; in this case, it is advantageous in terms of the maximum flow resistance for the partial gas stream in question to be situated under the connecting point, looking in the direction of flow.

An embodiment of the device, referred to again in the following as a "flow divider", in which flow resistors are inserted replaceably in the gas lines, has been found to be especially advantageous. Flow resistors in the form of metal components have been found to be especially reliable for this purpose. The components have, for example, a simple channel drilled through them. A through-channel can be produced easily with a high degree of precision. It can thus be guaranteed that the flow resistor will be highly reproducible. If necessary, the through-channel can also be enlarged easily. The flow divider can easily be optimized by adapting each of the flow resistances of the flow divider to the concrete requirements. This is advantageous, for example, when a multi-burner assembly is being used to deposit $SiO_2$ soot by a multi-burner assembly and when it is found that it is advantageous for the deposition rate of certain individual burners to be faster than that of adjacent burners.

In a preferred embodiment of the flow divider, the equalization chamber is designed as a cylinder, and the gas inlet openings are distributed uniformly in the axial direction along the longitudinal axis of the equalization chamber. The length of the equalization chamber is selected in correspondence with the geometric distribution of the gas consumers. When the consumers are arranged in a row, it can be advantageous for the length of the equalization chamber to be, for example, approximately the same as the length of the row of consumers. The uniform distribution of the gas inlet openings contributes to a homogeneous pressure distribution inside the equalization chamber.

A flow divider in which the number of gas inlet openings is the same as the number of gas consumers and/or the number of gas outlet openings has been found to be especially effective. In this way, the gas streams which should be supplied to each individual gas consumer, i.e., the gas streams which should leave the gas outlet openings of the equalization chamber, can be made available at the gas inlet openings in defined and controlled manner.

Especially with respect to goal of achieving the best-possible pressure equalization and the smallest-possible pressure differences inside the equalization chamber, it has been found advantageous for each gas inlet opening to be associated with at least one gas outlet opening and for the distance between a gas inlet opening and the gas outlet opening or openings associated with it to be approximately the same as the distances between all of the other inlet openings and their associated outlet openings.

A flow divider in which the equalization chamber can be heated has been found to be especially favorable. The heating option makes it possible to arrive at a temperature at which the gases present in the equalization chamber cannot condense. It can also be favorable to provide a heating option for the gas-carrying lines leading from or into the equalization chamber. Condensation inside the equalization chamber or in the lines can lead to a change in the rate at which the gas consumers are supplied.

In an embodiment of the flow divider with a cylindrical equalization tank, it has been found advantageous for the distance between the gas inlet openings to be in the range of 10–50 cm. At a spacing of more than 50 cm, a noticeable pressure gradient develops inside the equalization chamber. Decreasing the spacing to less than 10 cm fails to make any further significant contribution to the prevention of a pressure gradient.

An embodiment of the flow divider in which several, separately controllable gas streams can be supplied simultaneously through each gas inlet opening to the equalization chamber has been found advantageous, especially with respect to reducing the cost of the device. In the case that the equalization chamber is supplied with a gas mixture, it is advantageous to provide the mixing area before the gas inlet to the equalization chamber, i.e., before each gas inlet opening.

When several different gas streams are to be supplied to the gas consumers, it has been found to be especially favorable for the number of equalization chambers to be the same as the number of different gas streams. Normally, one partial gas stream will be supplied to each gas consumer by each equalization chamber. This type of embodiment of the flow divider guarantees that each partial gas stream is reproducible in itself and can be kept constant and controlled in itself.

DETAILED DESCRIPTION OF THE PREFERRED EMBODIMENT

Figure 1:
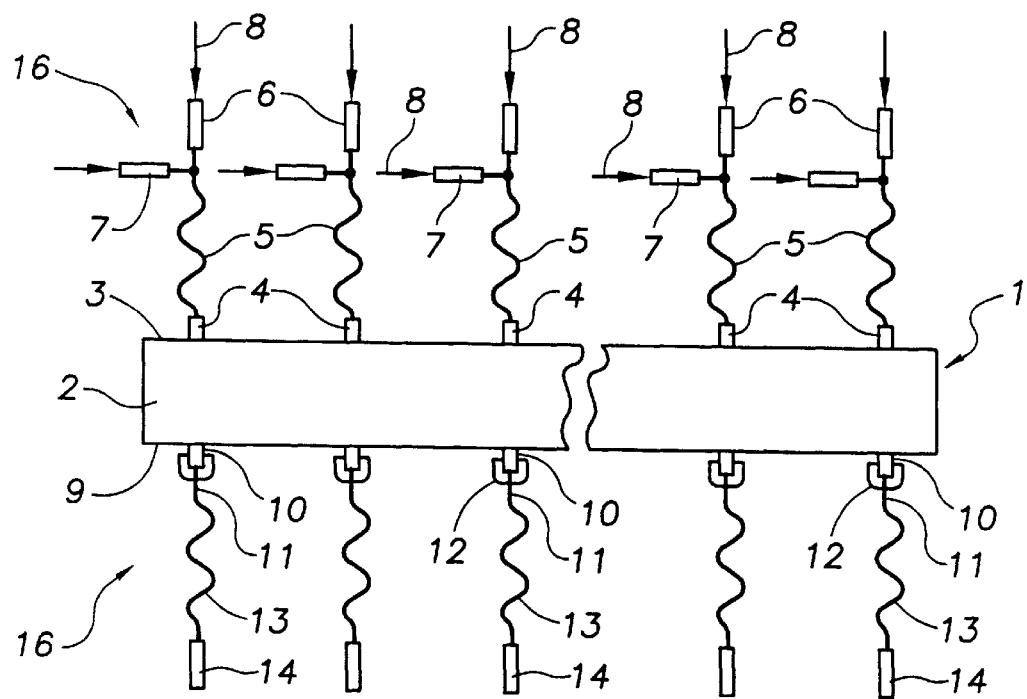
FIG. 1 is a schematic diagram showing a first embodiment of a flow divider with the same number of gas inlet openings and gas outlet openings.

In the embodiment of flow divider 1 according to FIG. 1, a tubular equalization tank 2 of high-grade steel is provided. On gas inlet side 3 of flow divider 1, equalization tank 2 has holes, spaced about 15 cm apart, in which tubular connectors 4 are mounted. (The lower edges of tubular connectors 4 facing the equalization tank 2 are approximately flush with the associated hole.) Each tubular connector 4 is connected by way of a connecting hose 5 of polytetrafluoroethylene (PTFE) to a mass flow controller 6 for a flow of $SiCl_4$ gas and to a mass flow controller 7 for a flow of oxygen gas. Directional arrows 8 show the flow directions of the gases mentioned. Components 4, 5, 6, 7 associated with each gas line on gas inlet side 3 and the corresponding gas inlet opening of equalization tank 2 are referred to collectively as gas inlet 15. A partial stream of the overall stream of gas being introduced into equalization tank 2 is supplied to equalization tank 2 through each gas inlet 15, this partial stream being determined by mass flow controllers 6, 7.

On gas outlet side 9 of flow divider 1, equalization tank 2 has the same number of holes as on gas inlet side 3. Tubular connectors 10 provided with an outside thread are welded in the holes. (The upper edges of tubular connectors 10 facing equalization tank 2 are approximately flush with the associated hole.) In each of the tubular connectors 10, a sleeve-like gas outlet nozzle 11 is installed, which is connected in a gas-tight manner to tubular connector 10 by means of a union nut 12, which engages with the outside thread on the connector. Gas outlet nozzle 11 consists of high-grade steel. Its inside diameter is machined precisely to within ±5 μm. Gas outlet nozzles 11 are each connected in a gas-tight manner by way of PTFE hoses 13, all of the same length, to soot-deposition burners 14 for quartz glass soot. Components 10, 11, 12, 13 associated with each gas line on gas outlet side 9 are referred to overall as gas line 16.

Build-up burner 14 consists of quartz glass. The inside diameter of its center nozzle, which is connected to PTFE hose 13, is approximately 30% larger than that of gas outlet nozzle 11. Each build-up burner 14 has additional connections (not shown in FIG. 1) for other burner gases such as hydrogen or oxygen.

In the following, the way in which the flow divider according to the invention operates is explained in greater detail on the basis of FIG. 1. To build up a porous body of $SiO_2$ soot, $SiCl_4$ is evaporated and supplied in a controlled manner together with oxygen as carrier gas by way of mass flow controllers 6, 7 to equalization tank 4 at a predetermined flow rate. To prevent pressure differences from developing inside cylindrical equalization tank 2, the gases are supplied through several gas inlets 15, distributed uniformly in the axial direction along the gas inlet side 3 of flow divider 1. The gas flows entering equalization tank 2 through gas inlets 15 are approximately equal. Any existing differences in the gas flows can be equalized in equalization tank 2. Inside equalization tank 2, therefore, the pressure differences are very small. Approximately the same gas pressure is therefore present at all tubular connectors 10, which are spaced equal distances apart along gas outlet side 9. Because the inside diameters of tubular connectors 10 are larger than the inside diameters of gas outlet nozzles 11 inserted into them, the same pressure is also present at all gas outlet nozzles 11. The inside diameter of gas outlet nozzle 11 is in each case the narrowest point of gas line 16, which connects equalization tank 2 to the various deposition burners 14. The gas outlet nozzles therefore represent the maximum flow resistance in gas lines 16, and this is where the maximum pressure drop occurs. The inside diameters of gas outlet nozzles 11 are machined very precisely and are all the same. As a result, the flow resistances are equal in all gas lines 16, and the gas streams in all gas lines 16 are also approximately equal after leaving gas outlet nozzles 11. Thus the high-grade steel flow resistances, which can be adjusted with great precision, make it possible to adjust the gas streams with a high degree of reproducibility and therefore guarantee that the soot bodies ultimately produced have a high degree of dimensional accuracy.

Because of the designed-in separation of the flow resistors in the form of gas outlet nozzles 11 from deposition burners 14, furthermore, no contamination can reach the resistors from deposition burners 14, and the changes in the flow resistors which such contamination would produce are therefore prevented. Flow divider 1 according to the invention is therefore characterized also by a uniformity in the flow resistance over time, which means that the soot bodies ultimately produced are axially homogeneous. This effect is even more pronounced in comparison with the flow dividers according to the state of the art because of the fact that variations in the gas feed resulting from defective or drifting mass flow controllers 6, 7 can be equalized because of the plurality of gas inlets 16.

Figure 2:
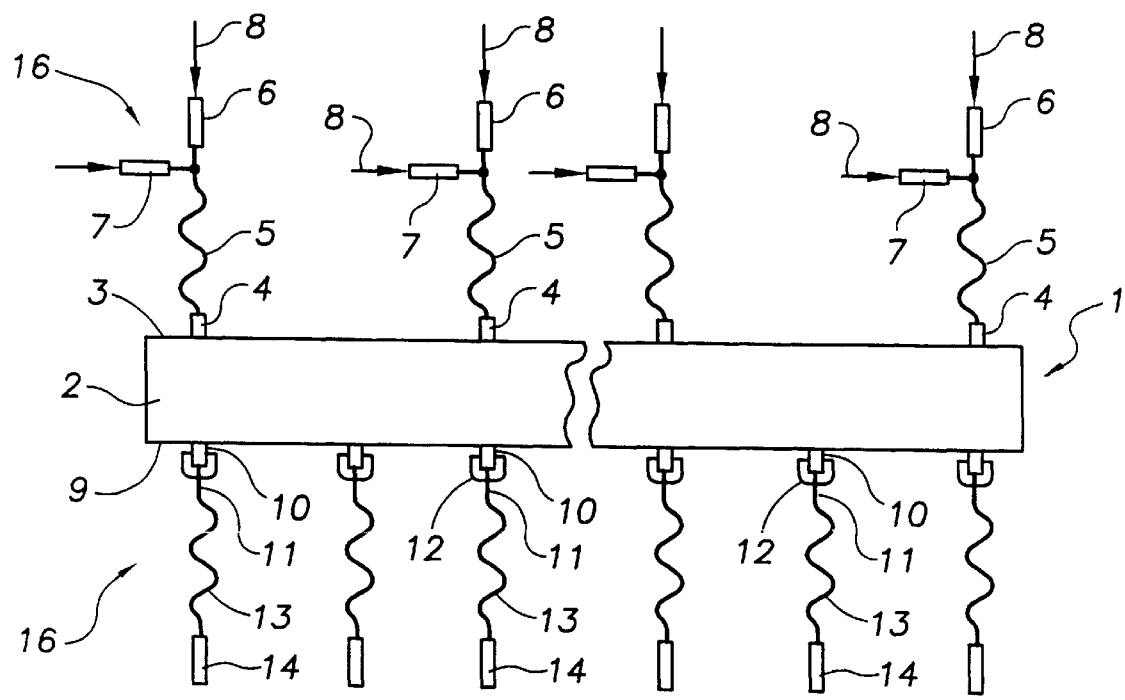
FIG. 2 shows another embodiment of a flow divider, in which the number of gas inlet openings is half the number of openings in the embodiment according to FIG. 1.
Figure 3:
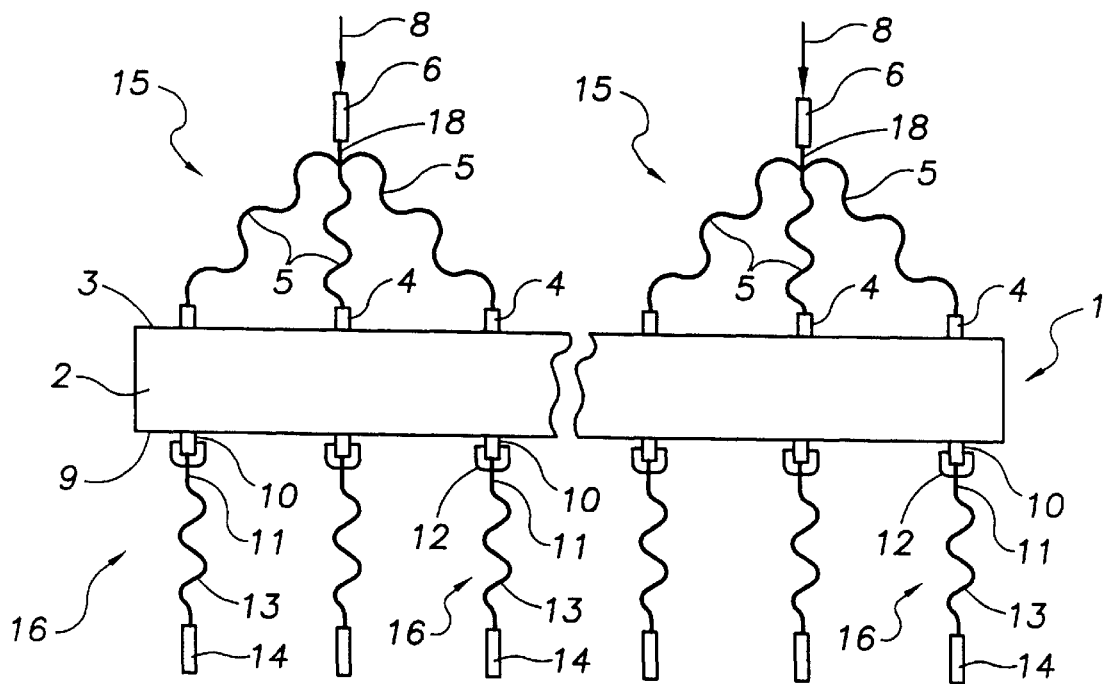
FIG. 3 shows another embodiment of a flow divider with the same number of gas inlet and gas outlet openings.
Figure 4:
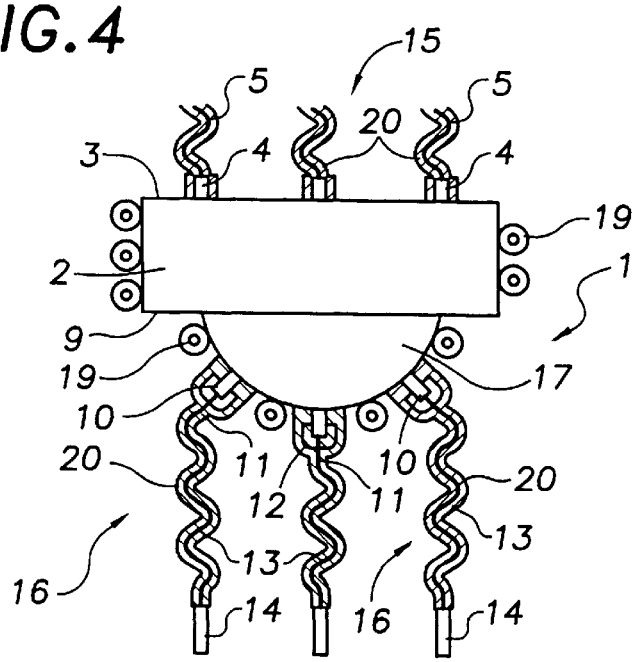
FIG. 4 shows another embodiment of a flow divider.

The reference numbers used in FIGS. 2–4 designate the same or equivalent components or parts of flow divider 1 as those with the same reference numbers already been explained on the basis of the embodiment in FIG. 1. FIG. 2 shows a flow divider 1, in which the number of gas inlet openings is approximately half the number of inlet openings in the flow divider according to FIG. 1. Because only half the number of mass flow controllers 6, 7 is therefore required, the embodiment according to FIG. 2 is thus low in cost. The disadvantage, however, is that, because of the distance of 30 cm between neighboring gas inlet openings, pressure differences can develop inside equalization tank 2, depending on the total amount of gas flowing into it.

In contrast to the embodiment according to FIG. 2, the design of the flow divider illustrated in FIG. 3 has only one mass flow controller for each gas inlet 15, namely, one for a stream of $SiCl_4$ gas. With respect to the cost savings for mass flow controllers 6, this embodiment has a similar effect as flow divider 1 according to FIG. 2, but it avoids the disadvantage described above, in that the distance between gas inlets 15 is only 15 cm. For this purpose, a branch point 18 is provided for each gas inlet 15, located in the area under mass flow controller 6, seen in flow direction 8; several PTFE connecting hoses 5, i.e., three hoses in this exemplary embodiment, branch off from this point and lead by way of a corresponding number of tubular connectors 4 to equalization tank 2. For the supply of the other burner gases such as oxygen and hydrogen to deposition burners 14, the same device is used as that explained in FIG. 3 for the example of a stream of $SiCl_4$ gas, except that the mass flow controller will be adjusted to the specific burner gas in question.

In the embodiment of flow divider 1 according to the invention illustrated in FIG. 4, an essentially rectangular equalization tank 2 has a hemispherical extension 17, to which several gas lines 16 are connected. Because of the spherical shape, an optimum homogeneous pressure distribution is guaranteed on the inside walls of extension 17 and therefore at gas outlet nozzles 11 provided there. To prevent the condensation of $SiCl_4$, heating coils 19 are provided on the outside walls of equalization tank 2, by means of which the interior space of equalization tank 2 can be kept at a temperature of at least 60° C. For the same reason, gas inlets 15 and gas lines 16 are wrapped with heating tapes 20.

What is claimed is:

1. Apparatus for dividing a stream of gas into a plurality of partial streams of gas, said apparatus comprising:
   an equalization chamber,
   gas inlet means for admitting gas to said equalization chamber, said gas inlet means comprising a first plurality of inlet openings in said equalization chamber,
   a second plurality of outlet openings in said equalization chamber for allowing a respective second plurality of gas streams to exit from said equalization chamber,
   a second plurality of gas consumers which receive respective said gas streams, and
   a gas line connecting each outlet opening to a respective said gas consumer, each gas line having maximum flow resistance means between said outlet opening and said gas consumer, and
   each of said maximum flow resistance means being inserted replaceably in the respective gas line.

2. Apparatus as in claim 1 wherein each said flow resistance means is a metal component.

3. Apparatus as in claim 1 wherein said equalization chamber is a cylindrical chamber having a central axis, said inlet openings being distributed with uniform axial spacing.

4. Apparatus as in claim 1 wherein said first plurality is equal to said second plurality.

5. Apparatus as in claim 1 wherein each said gas inlet opening is associated with at least one said gas outlet opening, each gas inlet opening being spaced from the associated outlet opening by a distance which is the same for each said inlet opening and the associated outlet opening.

6. Apparatus as in claim 1 wherein said equalization chamber is designed to be heated.

7. Apparatus as in claim 1 wherein said equalization chamber is cylindrical and adjacent said gas inlet openings are separated by 10 to 50 cm.

8. Apparatus as in claim 1 wherein said gas inlet means further comprises means for independently controlling a first plurality of gas streams which are supplied to respective said inlet openings.

* * * * *

UNITED STATES PATENT AND TRADEMARK OFFICE
CERTIFICATE OF CORRECTION

PATENT NO. : 6,152,166　　　　　　　　　　　　　　　　　　　Page 1 of 1
DATED : November 28, 2000
INVENTOR(S) : Bauscher et al.

It is certified that error appears in the above-identified patent and that said Letters Patent is hereby corrected as shown below:

Title page,
In the section entitled References, insert --

| | | |
|---|---|---|
| 5338363 | 1994 | Kawata |
| 5368062 | 1994 | Okumara |

Foreign Patent Documents

| | | |
|---|---|---|
| 9415707 | 1994 | WO |
| 0476218 | 1991 | EPO |
| 0529189 | 1992 | EPO |
| 4241932 | 1993 | Germany |
| 2277327 | 1994 | UK |
| 5980325 | 1984 | Japan |
| 6216224 | 1989 | Japan --. |

Signed and Sealed this

Twenty-eighth Day of August, 2001

Attest:

NICHOLAS P. GODICI
Attesting Officer　　　Acting Director of the United States Patent and Trademark Office